United States Patent [19]
Zehavi et al.

[11] Patent Number: 5,581,575
[45] Date of Patent: Dec. 3, 1996

[54] METHOD AND APPARATUS FOR TRANSMISSION OF VARIABLE RATE DIGITAL DATA

[75] Inventors: Ephraim Zehavi, San Diego; Andrew J. Viterbi, La Jolla, both of Calif.

[73] Assignee: Qualcomm Incorporated, San Diego, Calif.

[21] Appl. No.: 539,490

[22] Filed: Oct. 5, 1995

Related U.S. Application Data

[63] Continuation of Ser. No. 146,643, Nov. 1, 1993, abandoned.

[51] Int. Cl.$^6$ ............................................. H04L 27/30
[52] U.S. Cl. ........................... 375/200; 375/281; 370/335; 370/468
[58] Field of Search ........................ 375/200–210, 375/281; 370/94.1, 18; 380/34

[56] References Cited

U.S. PATENT DOCUMENTS

| | | | |
|---|---|---|---|
| 4,607,375 | 8/1986 | Lee | 375/1 X |
| 4,937,844 | 6/1990 | Kao | 375/240 |
| 5,204,876 | 4/1993 | Bruckert et al. | 375/1 |
| 5,325,088 | 6/1994 | Willard et al. | 370/94.1 X |
| 5,341,396 | 8/1994 | Higgins et al. | 375/1 |
| 5,365,543 | 11/1994 | Takahashi et al. | 375/1 |

FOREIGN PATENT DOCUMENTS

| | | | |
|---|---|---|---|
| 2664113 | 1/1992 | France | H04L 9/00 |
| 3426568 | 7/1984 | Germany | H04L 27/18 |
| 9217011 | 10/1992 | WIPO | H04K 1/100 |

OTHER PUBLICATIONS

Japanese Patent Abstract Application No. JP790168649 Publication No. JP56091548 Published Jul. 24, 1981 of NEC Corporation International Search Report Dated Mar. 16, 1995.

*Primary Examiner*—Stephen Chin
*Assistant Examiner*—T. Ghebretinsae
*Attorney, Agent, or Firm*—Russell B. Miller; Gregory D. Ogrod

[57] ABSTRACT

A communication system for transmitting variable rate data is disclosed wherein redundancy is added to the variable rate data to provide repetition symbols. The repetition symbol data is transmitted with symbol energy scaled in accordance to the rate of the variable rate data when the variable rate data is greater than or equal to a nominal data rate. When the variable rate data is less than the nominal data rate, the symbol data is transmitted at nominal symbol energy and redundancy is removed by transmission gating of a proportion of the transmission symbol data determined in accordance with the rate of the variable rate data. Furthermore, a receiver for receiving the variable rate data is disclosed which uses the redundancy in the transmitted data symbol stream to make a corrected estimate of the transmitted symbol data.

29 Claims, 4 Drawing Sheets

METHOD AND APPARATUS FOR TRANSMISSION OF VARIABLE RATE DIGITAL DATA

This is a continuation of application Ser. No. 08/146,643, filed Nov. 1, 1993, now abandoned.

BACKGROUND OF THE INVENTION

1. Field of the Invention

The present invention relates to cellular telephone systems. More specifically, the present invention relates to a novel and improved system and method for communicating variable data rate information using spread spectrum communication signals.

2. Description of the Related Art

The use of code division multiple access (CDMA) modulation techniques is one of several techniques for facilitating communications in which a large number of system users are present. Other multiple access communication system techniques, such as time division multiple access (TDMA), frequency division multiple access (FDMA) and AM modulation schemes such as amplitude companded single sideband (ACSSB) are known in the art. However, the spread spectrum modulation technique of CDMA has significant advantages over these modulation techniques for multiple access communication systems. The use of CDMA techniques in a multiple access communication system is disclosed in U.S. Pat. No. 4,901,307, issued Feb. 13, 1990, entitled "SPREAD SPECTRUM MULTIPLE ACCESS COMMUNICATION SYSTEM USING SATELLITE OR TERRESTRIAL REPEATERS", assigned to the assignee of the present invention, of which the disclosure thereof is incorporated herein by reference.

In the just mentioned patent, a multiple access technique is disclosed where a large number of mobile telephone system users each having a transceiver communicate through satellite repeaters or terrestrial base stations (also referred to as cell-sites stations, cell-sites or for short, cells) using code division multiple access (CDMA) spread spectrum communication signals. In using CDMA communications, the frequency spectrum can be reused multiple times, thus, permitting an increase in system user capacity. The use of CDMA results in a much higher spectral efficiency than can be achieved using other multiple access techniques.

The satellite channel typically experiences fading that is characterized as Rician. Accordingly, the received signal consists of a direct component summed with a multiple reflected component having Rayleigh fading statistics. The power ratio between the direct and reflected component is typically on the order of 6–10 dB, depending upon the characteristics of the mobile unit antenna and the environment about the mobile unit.

Contrasting with the satellite channel, the terrestrial channel experiences signal fading that typically consists of the Rayleigh faded component without a direct component. Thus, the terrestrial channel presents a more severe fading environment than the satellite channel in which Rician fading is the dominant fading characteristic.

The Rayleigh fading characteristic in the terrestrial channel signal is caused by the signal being reflected from many different features of the physical environment. As a result, a signal arrives at a mobile unit receiver from many directions with different transmission delays. At the UHF frequency bands usually employed for mobile radio communications, including those of cellular mobile telephone systems, significant phase differences in signals traveling on different paths may occur. The possibility for destructive summation of the signals may result, with on occasion deep fades occurring.

Terrestrial channel fading is a very strong function of the physical position of the mobile unit. A small change in position of the mobile unit changes the physical delays of all the signal propagation paths, which further results in a different phase for each path. Thus, the motion of the mobile unit through the environment can result in a quite rapid fading process. For example, in the 850 MHz cellular radio frequency band, this fading can typically be as fast as one fade per second per mile per hour of vehicle speed. Fading this severe can be extremely disruptive to signals in the terrestrial channel resulting in poor communication quality. Additional transmitter power can be used to overcome the problem of fading. However, such power increases effect both the user, in excessive power consumption, and the system by increased interference.

The CDMA modulation techniques disclosed in U.S. Pat. No. 4,901,307 offer many advantages over narrow band modulation techniques used in communication systems employing satellite or terrestrial repeaters. The terrestrial channel poses special problems to any communication system particularly with respect to multipath signals. The use of CDMA techniques permit the special problems of the terrestrial channel to be overcome by mitigating the adverse effect of multipath, e.g. fading, while also exploiting the advantages thereof.

In a CDMA cellular telephone system, the same frequency band can be used for communication in all cells. The CDMA waveform properties that provide processing gain are also used to discriminate between signals that occupy the same frequency band. Furthermore, the high speed pseudonoise (PN) modulation allows many different propagation paths to be separated, provided the difference in path delays exceed the PN chip duration, i.e. 1/bandwidth. If a PN chip rate of approximately 1 MHz is employed in a CDMA system, the full spread spectrum processing gain, equal to the ratio of the spread bandwidth to system data rate, can be employed against paths that differ by more than one microsecond in path delay from the desired path. A one microsecond path delay differential corresponds to differential path distance of approximately 1,000 feet. The urban environment typically provides differential path delays in excess of one microsecond, and up to 10–20 microseconds are reported in some areas.

In narrow band modulation systems such as the analog FM modulation employed by conventional telephone systems, the existence of multiple paths results in severe multipath fading. With wide band CDMA modulation, however, the different paths may be discriminated against in the demodulation process. This discrimination greatly reduces the severity of multipath fading. Multipath fading is not totally eliminated in using CDMA discrimination techniques because there will occasionally exist paths with delay differentials of less than the PN chip duration for the particular system. Signals having path delays on this order cannot be discriminated against in the demodulator, resulting in some degree of fading.

It is, therefore, desirable that some form of diversity be provided which would permit a system to reduce fading. Diversity is one approach for mitigating the deleterious effects of fading. Three major types of diversity exist: time diversity, frequency diversity and space diversity.

Time diversity can best be obtained by the use of repetition, time interleaving, and error detection and coding which is a form of repetition. The present invention employs each of these techniques as a form of time diversity.

CDMA by its inherent nature of being a wideband signal offers a form of frequency diversity by spreading the signal energy over a wide bandwidth. Therefore, frequency selective fading affects only a small part of the CDMA signal bandwidth.

Space or path diversity is obtained by providing multiple signal paths through simultaneous links from a mobile user through two or more cell-sites. Furthermore, path diversity may be obtained by exploiting the multipath environment through spread spectrum processing by allowing a signal arriving with different propagation delays to be received and processed separately. Examples of path diversity are illustrated in U.S. Pat. No. 5,101,501 entitled "SOFT HAND-OFF IN A CDMA CELLULAR TELEPHONE SYSTEM", filed Nov. 7, 1989, and U.S. Pat. No. 5,103,459 entitled "DIVERSITY RECEIVER IN A CDMA CELLULAR TELEPHONE SYSTEM", also filed Nov. 7, 1989, both assigned to the assignee of the present invention.

The deleterious effects of fading can be further controlled to a certain extent in a CDMA system by controlling transmitter power. A system for cell-site and mobile unit power control is disclosed in U.S. Pat. No. 5,056,109 entitled "METHOD AND APPARATUS FOR CONTROLLING TRANSMISSION POWER IN A CDMA CELLULAR MOBILE TELEPHONE SYSTEM", filed Nov. 7, 1989, also assigned to the assignee of the present invention.

The CDMA techniques as disclosed in U.S. Pat. No. 4,901,307 contemplates the use of coherent modulation and demodulation for both directions of the link in mobile-satellite communications. Accordingly, disclosed therein is the use of a pilot carrier signal as a coherent phase reference for the satellite-to-mobile link and the cell-to-mobile link. In the terrestrial cellular environment, however, the severity of multipath fading, with the resulting phase disruption of the channel, precludes usage of coherent demodulation technique for the mobile-to-cell link. The present invention provides a means for overcoming the adverse effects of multipath in the mobile-to-cell link by using noncoherent modulation and demodulation techniques.

The CDMA techniques as disclosed in U.S. Pat. No. 4,901,307 further contemplated the use of relatively long PN sequences with each user channel being assigned a different PN sequence. The cross-correlation between different PN sequences and the autocorrelation of a PN sequence for all time shifts other than zero both have a zero average value which allows the different user signals to be discriminated upon reception.

However, such PN signals are not orthogonal. Although the cross-correlations average to zero, for a short time interval such as an information bit time the cross-correlation follows a binomial distribution. As such, the signals interfere with each other much the same as if they were wide bandwidth Gaussian noise at the same power spectral density. Thus, the other user signals, or mutual interference noise, ultimately limits the achievable capacity.

The existence of multipath can provide path diversity to a wideband PN CDMA system. If two or more paths are available with greater than one microsecond differential path delay, two or more PN receivers can be employed to separately receive these signals. Since these signals will typically exhibit independence in multipath fading, i.e., they usually do not fade together, the outputs of the two receivers can be diversity combined. Therefore, a loss in performance only occurs when both receivers experience fades at the same time. A system that provides for the provision of two or more PN receivers in combination with a diversity combiner and a system for generating a waveform that permits path diversity combining operations to be performed is disclosed in U.S. Pat. No. 5,103,459 entitled "System and Method for Generating Signal Waveforms in CDMA Cellular Telephone System".

In order to support data transmission at variable data rates it has generally been required to vary the rates of encoding, interleaving and modulation in accordance with the input data rate. This rate variation has typically required relatively sophisticated control of channel encoding and decoding processes, thereby increasing system cost, complexity, in addition to requiring a modification of the current waveform signals.

Accordingly, it is the objective of the invention to provide a spread spectrum communication system in which communication channels are available for data transmission at both higher and lower than the nominal system rate. It is yet another object of the present invention to provide a spread spectrum communication system in which a common format is used for encoding, interleaving and modulating data to be transmitted at various data rates.

SUMMARY OF THE INVENTION

The present invention is a novel and improved method and apparatus for transmitting and receiving variable rate data in a spread spectrum communication system.

In the transmitter of the present invention, a plurality of user bit rates are accommodated for transmission. Those user bit rates can be grouped into those that are equal to or greater than a nominal bit rate, and those less than the nominal bit rate. The user data is provided to a repetition coder which provides redundancy into the user bits for user bit rates that are below a maximum bit rate such that the repetition symbol rate provided from the repetition coder is the same for all user bit rates. The repetition coded symbols are then provided to a transmit power amplifier, which operates in accordance with a signal provided from a transmission controller.

The transmission controller is responsive to the user bit rate in providing the control signal to the transmit power amplifier. For bit rates less than the nominal bit rate the transmission controller gates the transmission of the repetition symbols, so as to remove a predetermined portion of the redundancy in the repetition symbols. The transmission gated symbols are then transmitted at a symbol energy that is the same for transmitted symbols where the user bit data is less than the nominal bit rate. When the user bit rate is greater than or equal to the nominal bit rate, the redundancy is not removed, rather the symbol energy is scaled down in proportion to the amount of redundancy in the repetition symbol data.

In the receiver of the present invention, the signals transmitted as described above are received. The received signals are demodulated and provided to a repetition summer and energy calculator. The repetition summer and energy calculator takes advantage of the redundancy in the repetition symbols by summing the energies of the received repeated symbols to provide a series of energy values that correspond to the energies of received hypotheses. These energies are then provided to a metric calculator that provides a set of metrics, which are indicative of the likelihood of different received signal hypotheses. The metrics are then provided to a decoder which in response to the computed metrics estimates the transmitted signal.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
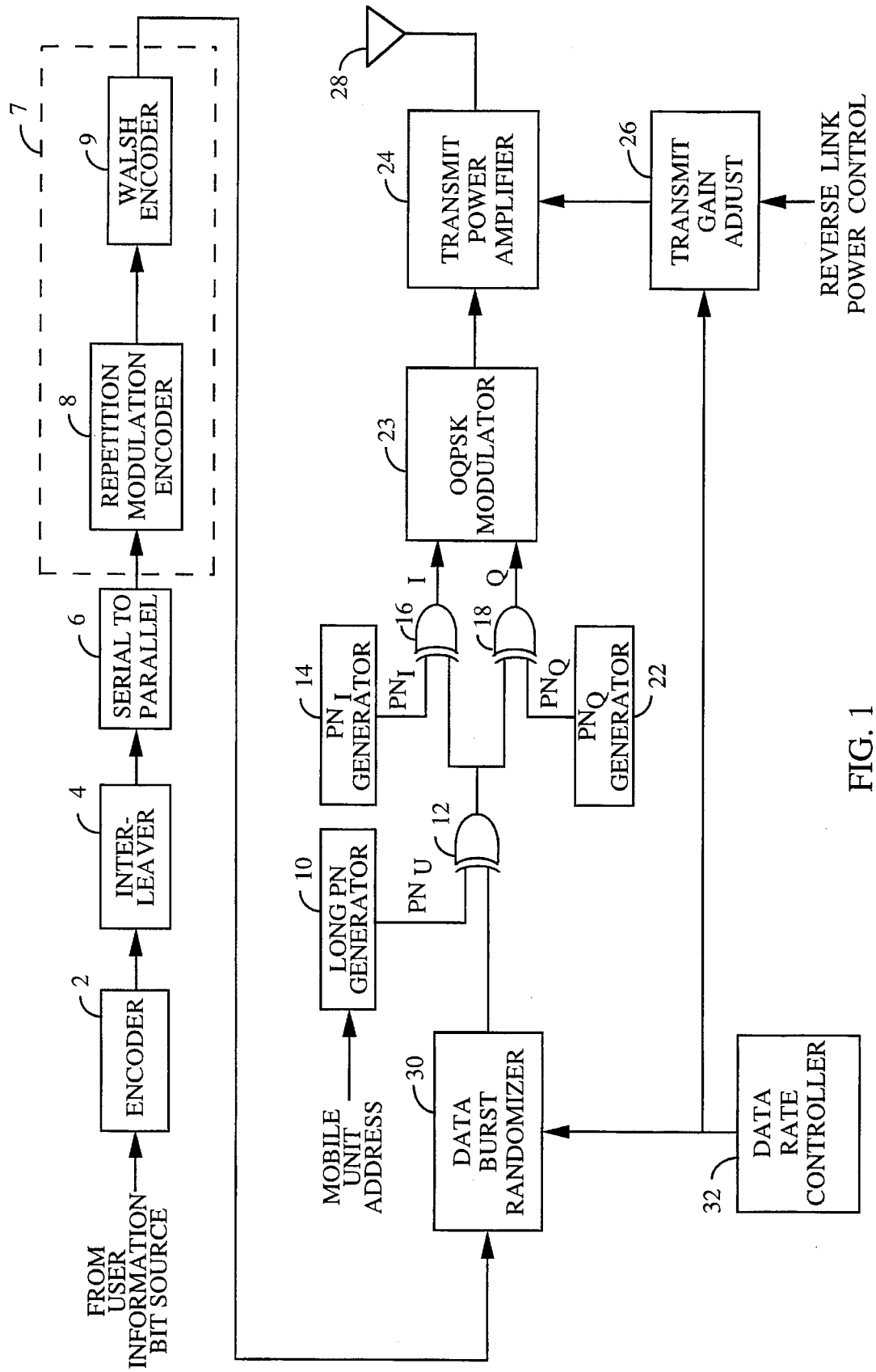
FIG. 1 is an exemplary block diagram of the transmitter of the present invention.

It is envisioned that the present invention is applicable to any variable rate digital communication system. The present invention is illustrated in an exemplary embodiment of a reverse link (remote user to central communications center) communications system in a personal communications system. FIG. 1 illustrates an exemplary embodiment of the variable data rate transmitter of the present invention. The variable rate user information bit data may be digital speech data or digital data such as video, facsimile, modem or other digital data. The user information bit rates can be divided into those above or equal to a predetermined nominal bit rate $R_{b(nom)}$ and those below $R_{b(nom)}$. The maximum user information bit rate that is accommodated by the communication system is denoted $R_{b(max)}$. In the exemplary embodiment, the user information bit rates include 1.2, 1.8, 2.4, 3.6, 4.8, 7.2, 9.6, 14.4, 19.2, and 38.4 kbps, where 9.6 kbps is the nominal bit rate $R_{b(nom)}$ and 38.4 kbps is the maximum bit rate $R_{b(max)}$. The rates provided represent exemplary embodiments. It is envisioned that the subject matter of the present invention is equally applicable to any digital transmission rate. Furthermore, the selection of 9.6 kbps as $R_{b(nom)}$ is again for exemplary purposes within the context of the exemplary set of rates. Within the context of the exemplary set of rates an alternative $R_{b(nom)}$ of interest is 4.8 kbps.

In the personal system-to-cell link, user analog voice signals are typically provided through a handset (not shown) as an input to an analog to digital (A/D) converter (not shown) which converts the analog signal to digital form. The digital signal is provided to a variable rate digital vocoder (not shown) where it is encoded. The vocoder will combine this signal with any other source of digital information that can be transmitted within a preset frame format of a fixed length, where the number of information bits per frame varies.

The user information bit data is provided to forward error correction (FEC) encoder 2 at a bit rate $R_b$, where in the exemplary embodiment the user information bit data is convolutionally encoded to provide encoded symbols. Encoder 2 is a rate r encoder, meaning that encoder 2 generates 1/r encoded symbols for each user information bit it receives. Thus, the encoded symbol rate of encoder 2 is $R_b/r$. In the exemplary embodiment, the message encoding and modulation process begins with a convolutional encoder of constraint length K=9 and code rate r=⅓. The generators for the code are $G_1$=557 (octal), $G_2$=663 (octal), and $G_3$=711 (octal). The number of code symbols in 20 msec, at the nominal bit rate $R_{b(nom)}$ of 9600 bps and a code rate r=⅓, is 576. At a nominal data rate of $R_b$=9600 bits per second, the encoder produces 28,800 binary symbols per second.

The encoded symbols are provided to interleaver 4 which in the exemplary embodiment is a block interleaver spanning 20 msec, exactly one frame in duration. The code symbols are written into the interleaver memory array by rows and read out by columns.

When the user information bit rate $R_b$ is less than the nominal bit rate $R_{b(nom)}$, or alternatively the encoded symbol rate $R_b/r$ is less than the nominal encoded symbol rate $R_{b(nom)}/r$, interleaver 4 has a secondary role of providing redundancy to the encoded symbols. When the user information bit rate $R_b$ is less than $R_{b(nom)}$, the interleaver introduces an encoded symbol redundancy (red1) where:

$$red1 = \frac{R_{B(nom)}}{R_B} \qquad (1)$$

The interleaved symbols comprise a first version of each encoded symbol and red1-1 repeated versions of each encoded symbol. Thus, the interleaved symbols are provided at rate $R_{b(nom)}/r$ when the user information bit rate is less than or equal to the nominal bit rate $R_{b(nom)}$. For user bit rates greater than or equal to the nominal bit rate $R_{b(nom)}$, the interleaved symbol rate is the same as the encoded symbol rate.

Interleaver 4 provides the interleaved symbols to serial to parallel element 6 which provides the interleaved symbol data as n-tuples of the interleaved symbols such that the n-tuples rate is equal to the rate at which the data is provided from interleaver 4 divided by n. So if the user information bit rate $R_b$ was greater than or equal to the nominal bit rate $R_{b(nom)}$ then the n-tuple rate is $R_b/(r.n)$. If the user information bit rate $R_b$ is less than the nominal bit rate $R_{b(nom)}$ then the n-tuple rate is $R_{b(nom)}/(r.n)$, due to the redundancy introduced by interleaver 4. In the exemplary embodiment, n is equal to 6, so that the n-tuple rate for the nominal user bit rate of 9600 is 4800 n-tuples/s.

Serial to parallel element 6 provides the n-tuples to overlay encoding element 7. Overlay encoding element 7 comprises repetition modulation encoder 8 and Walsh encoder 9. The n-tuples are provided to repetition modulation encoder 8 which provides symbol repetition based on the user information bit rate ($R_b$) to provide repetition modulation symbols. Repetition modulation encoder 8 provides redundancy (red2) of the form:

$$red2 = \begin{cases} R_{B(max)}/R_{B(nom)} & \text{for } R_B < R_{B(nom)} \\ R_{B(max)}/R_B & \text{for } R_B \geq R_{B(nom)} \end{cases} \qquad (2)$$

For each n-tuple provided to repetition modulation encoder 8, repetition modulation encoder 8 provides red2 identical and consecutive n-tuple outputs referred to as repetition modulation symbols, such that the resulting repetition modulation symbol rate is a constant $R_{b(max)}/(r.n)$ for all input data rates $R_b$. In the exemplary embodiment, where $R_{b(max)}$ is 38.4 kbps the repetition modulation symbol rate is 19,200 repetition symbols per second where each repetition symbol is six binary digits in size.

In the personal communication system-to-cell link also referred to as the reverse link, the channel characteristics dictate that the modulation techniques be modified. In particular, the use of a pilot carrier as is used in the cell-to-personal system link is no longer feasible. The pilot carrier must be powerful in order to provide a good phase reference for data modulation. With the cell-site transmitting many simultaneous transmissions to personal systems, a single pilot signal can be shared by all the personal systems.

Therefore, the pilot signal power per active personal system is quite small.

In the personal system-to-cell link, however, each personal system has its own phase reference. If a pilot were used, it would require that each personal system transmit it own pilot. This situation is clearly not desirable since overall system capacity would be greatly reduced due to the interference caused by the presence of a larger number of high power pilot signals. Therefore, a modulation capable of efficient demodulation without a pilot signal must be used.

With the personal system-to-cell channel corrupted by Rayleigh fading, resulting in a rapidly varying channel phase, coherent demodulator techniques, such as a Costas loop which derives phase from the received signal, are not feasible. Other techniques such as differentially coherent PSK can be employed but fail to provide the desired level of signal-to-noise ratio performance.

Thus, in the exemplary embodiment, the repetition modulation symbols are provided to an orthogonal waveform coder that maps the six binary digit repetition modulation symbols into an orthogonal signal set. It is well known in the art that a set of n orthogonal binary sequences, each of length n, for n any power of 2 can be constructed, see *Digital Communications with Space Applications*, S. W. Golomb et al., Prentice-Hall, Inc., 1964, pp. 45–64. In fact, orthogonal binary sequence sets are also known for most lengths which are multiples of four and less than two hundred. One class of such sequences that is easy to generate is called the Walsh function, also known as Hadamard matrices.

A Walsh function of order n can be defined recursively as follows:

$$W(n) = \begin{vmatrix} W(n/2), W(n/2) \\ W(n/2), W'(n/2) \end{vmatrix}$$

where W' denotes the logical complement of W, and W(1)= |0|. Thus, $$W(2) = \begin{vmatrix} 0,0 \\ 0,1 \end{vmatrix} \text{ and}$$

$$W(4) = \begin{vmatrix} 0,0,0,0 \\ 0,1,0,1 \\ 0,0,1,1 \\ 0,1,1,0 \end{vmatrix}$$

W(8) is as follows:

$$W(8) = \begin{vmatrix} 0,0,0,0,0,0,0,0 \\ 0,1,0,1,0,1,0,1 \\ 0,0,1,1,0,0,1,1 \\ 0,1,1,0,0,1,1,0 \\ 0,0,0,0,1,1,1,1 \\ 0,1,0,1,1,0,1,0 \\ 0,0,1,1,1,1,0,0 \\ 0,1,1,0,1,0,0,1 \end{vmatrix}$$

A Walsh sequence is one of the rows of a Walsh function matrix. A Walsh function of order n contains n sequences, each of length n bits.

A Walsh function of order n (as well as other orthogonal functions) has the property that over the interval of n code symbols, the cross-correlation between all the different sequences within the set is zero, provided that the sequences are time aligned with each other. This can be seen by noting that every sequence differs from every other sequence in exactly half of its bits. It should also be noted that there is always one sequence containing all zeroes and that all the other sequences contain half ones and half zeroes.

Neighboring cells and sectors can reuse the Walsh sequences because the outer PN codes used in neighboring cells and sectors are distinct. Because of the differing propagation times for signals between a particular personal system's location and two or more different cells, it is not possible to satisfy the condition of time alignment required for Walsh function orthogonality for both cells at one time. Thus, reliance must be placed on the outer PN code to provide discrimination between signals arriving at the personal system unit from different cells.

Referring to FIG. 1, each repetition modulation symbol is provided to an M-ary Walsh encoder 9, where in the exemplary embodiment $M=2^n=64$. In response, M-ary Walsh encoder 9, for each repetition modulation symbol, each comprising n=6 binary symbols, generates a Walsh symbol comprising M Walsh chips. The resulting Walsh chip rate out of M-ary Walsh encoder 9 is $(M.R_{b(max)})/(r.n)$ or in the exemplary embodiment 1,228.8 ksps. The Walsh chips are provided to data burst randomizer 30, which is responsive to signals provided by data rate control element 32.

Data burst randomizer 30 selectively removes some of the introduced redundancy for data at input rates $R_b$ less than $R_{b(nom)}$. A preferred method and apparatus of a data burst randomizer is disclosed in copending U.S. Patent Application entitled "DATA BURST RANDOMIZER", Ser. No. 07/846,312, filed Jan. 16, 1992, also assigned to the assignee of the present invention. For data at rates less than $R_{b(nom)}$, data burst randomizer 30 removes the amount of redundancy introduced by interleaver 4. That is, for user information bit rates $R_b$ less than $R_{b(nom)}$ data burst randomizer 30 removes red-1 redundant Walsh chips of every red1 Walsh chips received. Data burst randomizer 30 further temporally rearranges the Walsh chips in accordance with pseudorandom code to provide randomized symbols. For user information bit rates $R_b$ less than the nominal bit rate $R_{b(nom)}$, the average randomized Walsh chip rate is $(M.R_{b(max)}.R_b)/(r.n.R_{b(nom)})$. For user information bit rates greater than or equal to the nominal bit rate the symbol rate remains unchanged.

The randomized Walsh chips are provided to one input to exclusive-OR gate 12. PN generator 10, responsive to a mobile unit address, provides PN sequence $PN_U$. This PN sequence can either be assigned only for the duration of the call or assigned permanently to the personal system unit. $PN_U$ in the exemplary embodiment is a user specific 42-bit sequence that is provided at a rate of $R_c=1.2288$ MHz such that there is exactly one PN chip for each Walsh chip. $PN_U$ is a zero-shift sequence, also referred to as the pilot sequences. $PN_U$ provides the second input to exclusive-OR gate 12. The randomized Walsh chips and the $PN_U$ sequence are exclusive-OR'ed an exclusive-OR gate 12 and provided as in input to both of exclusive-OR gates 16 and 18.

PN generators 14 and 22 generate $PN_I$ and $PN_Q$ sequences, respectively. In the exemplary embodiment, $PN_I$ and $PN_Q$ generators are 15-bit generators running at $R_c=1.2288$ MHz. $PN_I$ and $PN_Q$ sequences are zero-shift sequences, also referred to as the pilot sequences. In the exemplary embodiment, all personal communication stations use the same $PN_I$ and $PN_Q$ sequences. The other input of exclusive-OR gates 16 and 18 are respectively provided with the $PN_I$ and $PN_Q$ sequences output from PN generators 14 and 22. The sequences $PN_I$ and $PN_Q$ are exclusive-OR'ed in the respective exclusive-OR gates with the output form exclusive-OR gate 12 to provide the I and Q modulation symbols.

In an alternative embodiment, two different phases of the user PN code might be produced and used to modulate the two carrier phases of the quadraphase waveform, dispensing with the need for using the length 32768 sequences. In yet another alternative, the personal system-to-cell link might utilize only bi-phase modulation, also dispensing with the need for the short sequences.

In another alternative modulation scheme for the personal system-to-cell link, the same modulation scheme would be used as for the cell-to-personal system link. Each personal system would utilize the pair of 32768 length sector codes as outer codes. The inner code would utilize a length M (M=64) Walsh sequence that is assigned to the personal system for use while it is in that sector. Nominally, the same Walsh sequence would be assigned to the personal system for the personal system-to-cell link as is used for the cell-to-personal system link.

The two resulting modulation sequences I and Q are provided to OQPSK modulator 23 wherein the sequences bi-phase modulate a quadrature pair of sinusoids and are summed. The resulting signal is then bandpass filtered, translated to the final RF frequency, filtered and provided to transmit power amplifier 24. The ordering of the filtering, translation and modulation operations may be interchanged.

The modulation signal is provided to transmit power amplifier 24, which is a variable gain amplifier controlled by transmit gain adjust element 26. Transmit gain adjust element is responsive to a signal indicative of the data rate of the signal for transmission from data rate controller 32 determines a gain for transmit power amplifier 24. Transmit Gain adjust element 26 determines the transmission energy of each symbol in accordance the following formula:

$$Ew = \begin{cases} 2E_b & \text{for } R_b = R_{b(max)} \\ \dfrac{R_b}{R_{b(max)}} E_b & \text{for } R_{b(nom)} < R_b < R_{b(max)} \\ \dfrac{R_{b(nom)}}{R_{b(max)}} & \text{for } R_b \leq R_{b(nom)} \end{cases},$$

where $E_b$ is the fixed bit energy. In the preferred embodiment, transmit gain adjust element 26 is further responsive to a reverse link power control signal. The amplified modulation signal is provided to antenna 28 for transmission through the air.

A summary of the symbol rates and transmission energies for the exemplary embodiment is provided in the table below.

| Parameter | 960 | 4800 | 2400 | 1200 | Units |
|---|---|---|---|---|---|
| PN Chip Rate | 1.2288 | 1.2288 | 1.2288 | 1.2288 | Mcps |
| Code Rate | 1/3 | 1/3 | 1/3 | 1/3 | bits/code sym |
| Transmit Duty Cycle | 100.0 | 50.0 | 25.0 | 12.5 | % |
| Code Symbol Rate | 28,800 | 28,800 | 28,800 | 28,800 | sps |
| Modulation | 6 | 6 | 6 | 6 | code sym/mod symbol |
| Modulation Symbol Rate | 4800 | 4800 | 4800 | 4800 | sps |
| Repetition Modulation Symbol Code Rate | 1/4 | 1/4 | 1/4 | 1/4 | mod symbols/Walsh symbol |
| Walsh SymbolRate | 19200 | 19200 | 19200 | 19200 | kcps |
| Walsh ChipRate | 1.2288 | 1.2288 | 1.2288 | 1.2288 | Mcps |
| Mod Symbol Duration | 208.33 | 208.33 | 208.33 | 208.33 | µs |
| PN Chips/Code Symbol | 42.67 | 42.67 | 42.67 | 42.67 | PN chip/code symbol |
| PN Chips/Walsh symbol | 64 | 64 | 64 | 64 | PN chip/mod symbol |
| PN Chips/Walsh Chip | 1 | 1 | 1 | 1 | PN chips/Walsh chip |
| Energy Per Walsh Symbol | $E_b/2$ | $E_b/2$ | $E_b/2$ | $E_b/2$ | |

| Parameter | 14400 | 7200 | 3600 | 1800 | Units |
|---|---|---|---|---|---|
| PN Chip Rate | 1.2288 | 1.2288 | 1.2288 | 1.2288 | Mcps |
| Code Rate | 1/2 | 1/2 | 1/2 | 1/2 | bits/code sym |
| Transmit Duty Cycle | 100.0 | 50.0 | 25.0 | 12.5 | % |
| Code Symbol Rate | 28,800 | 28,800 | 28,800 | 28,800 | sps |
| Modulation | 6 | 6 | 6 | 6 | code sym/mod symbol |
| Modulation Symbol Rate | 4800 | 4800 | 4800 | 4800 | sps |
| Repetition Modulation Symbol Code Rate | 1/4 | 1/4 | 1/4 | 1/4 | mod symbols/Walsh symbol |
| Walsh SymbolRate | 19200 | 19200 | 19200 | 19200 | kcps |
| Walsh ChipRate | 1.2288 | 1.2288 | 1.2288 | 1.2288 | Mcps |
| Mod Symbol Duration | 208.33 | 208.33 | 208.33 | 208.33 | µs |
| PN Chips/Code Symbol | 42.67 | 42.67 | 42.67 | 42.67 | PN chip/code symbol |
| PN Chips/Walsh symbol | 64 | 64 | 64 | 64 | PN chip/mod symbol |
| PN Chips/Walsh Chip | 1 | 1 | 1 | 1 | PN chips/Walsh chip |
| Energy Per Walsh Symbol | $3E_b/4$ | $3E_b/4$ | $3E_b/4$ | $3E_b/4$ | |

| Parameter | 9600 | 19200 | 38400 | Parameter | Units |
|---|---|---|---|---|---|
| PN Chip Rate | 1.2288 | 1.2288 | 1.2288 | $R_{chip}$ | Mcps |
| Code Rate | 1/3 | 1/3 | 1/3 | r | bits/code sym |
| Transmit Duty Cycle | 100.0 | 100.0 | 100.0 | | % |
| Code Symbol Rate | 28800 | 57600 | 115200 | $R_s$ | sps |
| Modulation | 6 | 6 | 6 | log M | code sym/mod symbol |
| Modulation Symbol Rate | 4800 | 9600 | 19200 | $R_m$ | sps |
| Repetition Modulation Symbol Code Rate | 1/4 | 1/2 | 1 | $R_p$ | mod symbols/Walsh symbol |

| | | | | |
|---|---|---|---|---|
| Walsh SymbolRate | 19200 | 19200 | 19200 | $R_w$ | kcps |
| Walsh ChipRate | 1.2288 | 1.2288 | 1.2288 | $R_{wchip}$ | kcps |
| Mod Symbol Duration | 208.33 | 104.16 | 52.08 | $1/T_w$ | μs |
| PN Chips/Code Symbol | 42.67 | 21.33 | 10.67 | $R_c/R_m$ | PN chip/code symbol |
| PN Chips/Walsh symbol | 64 | 64 | 64 | $R_c/R_s$ | PN chip/mod symbol |
| PN Chips/Walsh Chip | 1 | 1 | 1 | $R_c/R_{wchip}$ | PN chips/Walsh chip |
| Energy Per Walsh Symbol | $E_b/2$ | $E_b$ | $2E_b$ | $R_c/R_{wchip}$ | PN chips/Walsh chip |

In the exemplary-embodiment, each cell-site utilizes two receiver systems with each having a separate antenna and analog receiver for space diversity reception. In each of the receiver systems the signals are processed identically until the signals undergo a finger combination process.

Figure 2:
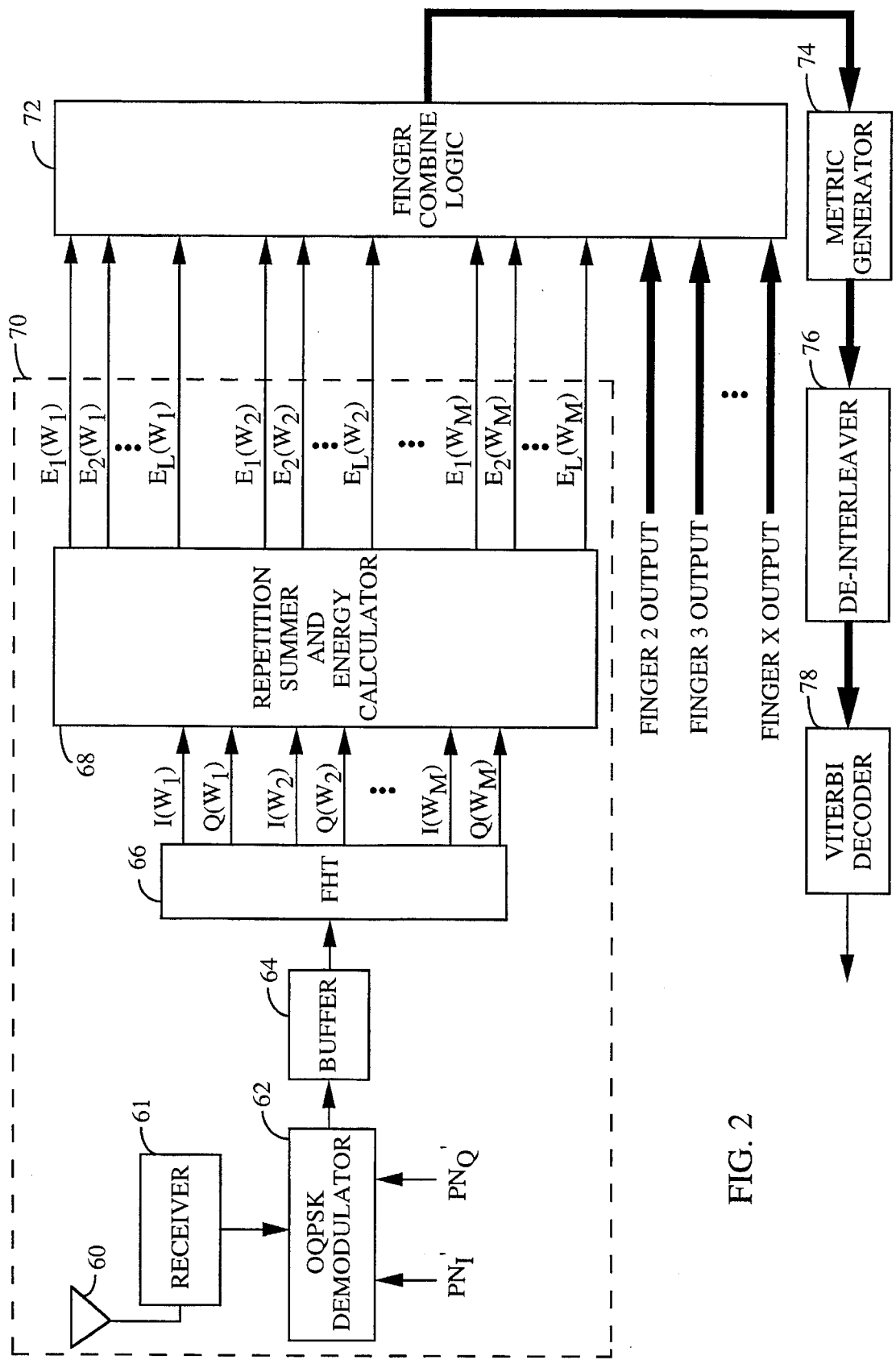
FIG. 2 is an exemplary block diagram of the receiver system of the present invention.

Now turning to FIG. 2, a receiver is illustrated for receiving and demodulating the data sent by the transmitter of FIG. 1. The signal transmitted by antenna 28 is received by antenna 60 accompanied by possible deleterious effects of the channel. Signals received on antenna 60 are provided to analog receiver 61. The details of receiver 61 are further illustrated in FIG. 3.

Signals received on antenna 60 are provided to downconverter 84 which is comprised of RF amplifier 80 and mixer 82. The received signals are provided as an input to RF amplifier 80 where they are amplified and output to an input of mixer 82. A second input of mixer 82 is coupled to the output from frequency synthesizer 86. The amplified RF signals are translated in mixer 82 to an IF frequency by mixing with the frequency synthesizer output signal.

The IF signals are then output from mixer 82 to bandpass filter (BPF) 88, typically a Surface Acoustic Wave (SAW) filter having a passband of 1.25 MHz, where they are bandpass filtered. The filtered signals are output from BPF 88 to IF amplifier 90 where the signals are amplified. The amplified IF signals are output from IF amplifier 90 to analog to digital (A/D) converter 92 where they are digitized at a rate of about $8R_c$ or $4R_c$ (corresponding to 9.8304 or 4.9152 MHz clock), where $R_c$ is the PN chip rate 1.288 MHz. The digitized IF signals are output from (A/D) converter 92 to demodulator 62. The signals output from receiver 61 are I' and Q' channel signals. Although illustrated with A/D converter 92 being a single device with later splitting of the I' and Q' channel signals, it is envisioned that channel splitting may be done prior to digitizing with two separate A/D converters provided for digitizing the I' and Q' channels. Schemes for the RF-IF-Baseband frequency downconversion and analog to digital conversion for I' and Q' channels are well known in the art.

Each data receiver tracks the timing of the received signal it is receiving. This is accomplished by the well known technique of correlating the received signal by a slightly early local reference PN and correlating the received signal with a slightly late local reference PN. The difference between these two correlations will average to zero if there is no timing error. Conversely, if there is a timing error, then this difference will indicate the magnitude and sign of the error and the receiver's timing is adjusted accordingly.

Figure 3:
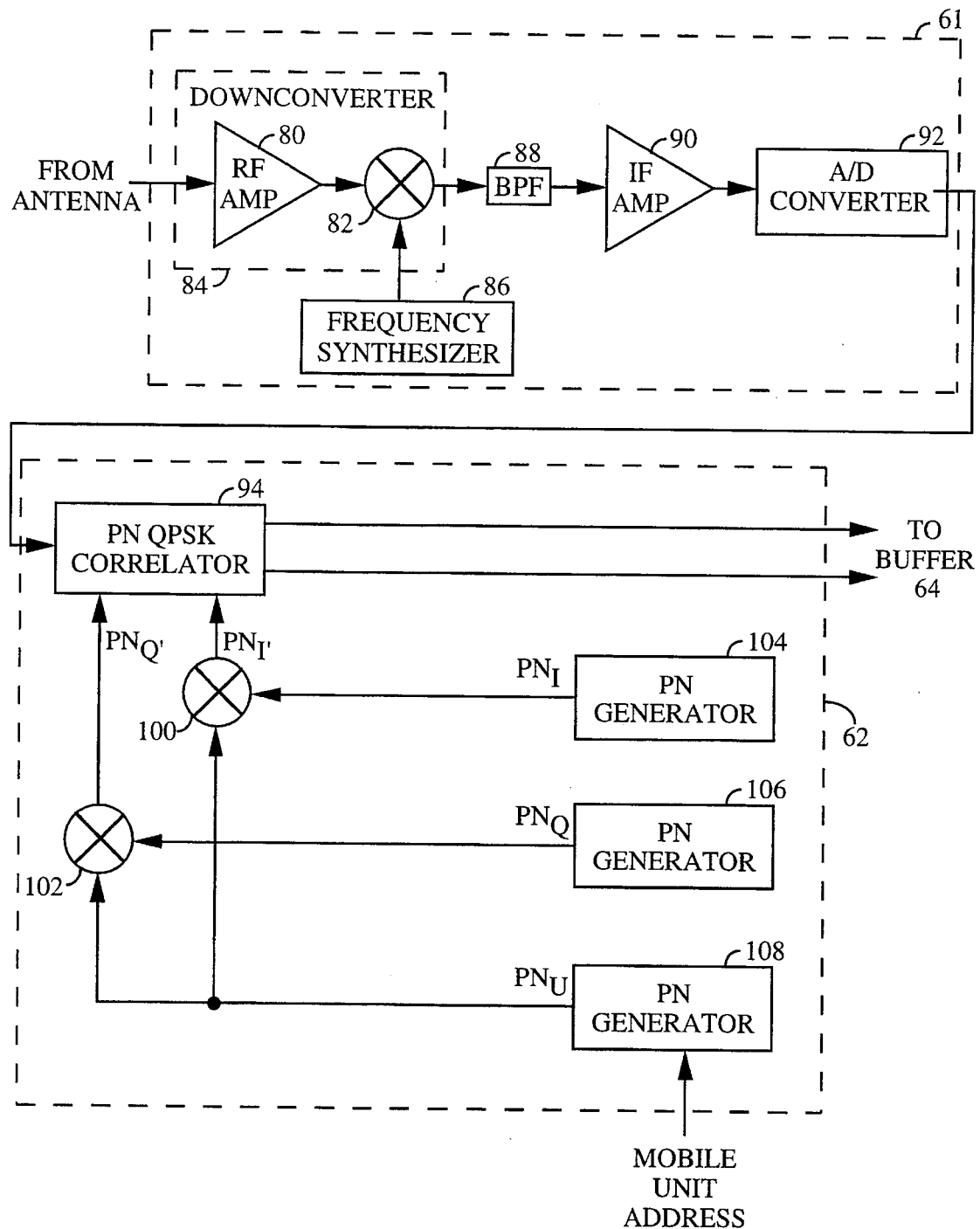
FIG. 3 is a an exemplary block diagram of the receiver and demodulator of the present invention.

As illustrated in FIG. 3, receiver 62 includes two PN generators, PN generators 104 and 106, which generate two different short code PN sequences of the same length. These two PN sequences are common to those of all cell-site receivers and all personal system units with respect to the outer code of the modulation scheme. PN generators 104 and 106 provide the output sequences $PN_I'$ and $PN_Q'$ respectively. The $PN_I'$ and $PN_Q'$ sequences are referred to as the In-Phase (I') and Quadrature (Q') channel PN sequences.

The two PN sequences, $PN_I'$ and $PN_Q'$, are generated by different polynomials of degree 15, augmented to produce sequences of length 32768 rather than 32767 which would normally be produced. For example, the augmentation may appear in the form of the addition of a single zero to the run of fourteen 0's in a row which appears one time in every maximal linear sequence of degree 15. In other words, one state of the PN generator would be repeated in the generation of the sequence. Thus the modified sequence contains one run of fifteen 1's and one run of fifteen 0's. Such a PN generator circuit is disclosed in U.S. Pat. No. 5,228,054 entitled "POWER OF TWO LENGTH PSEUDO-NOISE SEQUENCE GENERATOR WITH FAST OFFSET ADJUSTMENTS", filed Apr. 3, 1992, and assigned to the assignee of the present invention.

In the exemplary embodiment, demodulator 62 also includes a long code PN generator 108 which generates a $PN_U$ sequence corresponding to a PN sequence generated by the personal system unit in the personal system-to-cell link. PN generator 124 can be a maximal linear sequence generator that generates a user PN code that is very long, for example degree 42, time shifted in accordance with an additional factor such as the personal system unit address or user ID to provide discrimination among users. Thus the cell-site received signal is modulated by both the long code PNU sequence and the short code $PN_I$ and $PN_Q$ sequences. In the alternative, a non-linear encryption generator, such as an encryptor using the data encryption standard (DES) to encrypt a M-symbol representation of universal time using a user specific key, may be utilized in place of PN generator 108. The $PN_U$ sequence output from PN generator 108 is mixed with the $PN_I$ and $PN_Q$ sequences, respectively, in mixers 100 and 102 to provide the sequences $PN_I'$ and $PN_Q'$.

The sequences $PN_I'$ and $PN_Q'$ are provided to PN QPSK correlator 94 along with the I and Q channel signals output from receiver 61. Correlator 94 in the exemplary embodiment operates in conjunction with a sample decimator or interpolation filter (not shown). The sample decimator or interpolation filter acts in accordance with a timing signal (not shown) to provide samples at a rate equal to the Walsh chip rate to a correlation measurement element (not shown). The correlation element within correlator 94 is utilized to correlate the I' and Q' channel data with the $PN_I'$ and $PN_Q'$ sequences. The correlated I' and Q' data are provided as inputs to buffer 64. Buffer 64 then provides an I'-block and a Q'-block, each of M elements (where M=64 in the exemplary embodiment).

The demodulator in the cell-site could build up a phase reference over a short interval using the technique described in the article "Nonlinear Estimation of PSK-Modulated Carrier with Application to Burst Digital Transmission", Andrew J. Viterbi and Audrey M. Viterbi, IEEE Transactions On Information Theory, Vol IT-29, No. 4, July 1983. For example, a phase reference could be averaged over only a few successive modulation symbols as described in the aforementioned article.

The performance of the just described alternative scheme, however, will be inferior to the preferred embodiment in the presence of severe Rayleigh fading and multipath conditions. However, in certain environments where fading and multipath are less severe or changing slowly, for example, indoor personal communication systems, low mobility personal communication systems, satellite to personal communication system channels and in certain land to personal communication system channels, the performance of the alternative system could be better than the exemplary embodiment.

In an alternative approach of maintaining time alignment between the transmitter and the receiver of the present invention, each cell receiver determines the time error from nominal timing of each received signal. If a given received signal lags in timing, then the associated cell modulator and transmitter will transmit a command to this personal communication system to advance its transmit timing by a small increment. Conversely, if the received signal timing of a personal communication system leads the nominal timing, a command to retard by a small increment is transmitted to the personal communication system. The timing adjustment increments are made on the order of ⅛ PN chip or 101.7 nanoseconds. The commands are transmitted at a relatively low rate, on the order of 10 to 50 Hz and consist of a single bit inserted into the digital voice data flow.

If each cell receiver receiving a personal communication system signal performs the above time error measurement and correction transmission operation, then all the personal communication systems' received signals will normally be received with approximately the same timing, resulting in reduced interference.

FHT element 66 computes dot products between each of the possible M Walsh symbols and the I' block and Q' block to provide 2M dot product values. The dot product between the I' block and Q' block and a given Walsh symbol $W_i$ is denoted $I'(W_i)$ and $Q'(W_i)$ respectively. The dot products are then provided to repetition summer and energy calculator (RSEC) 68.

Figure 4:
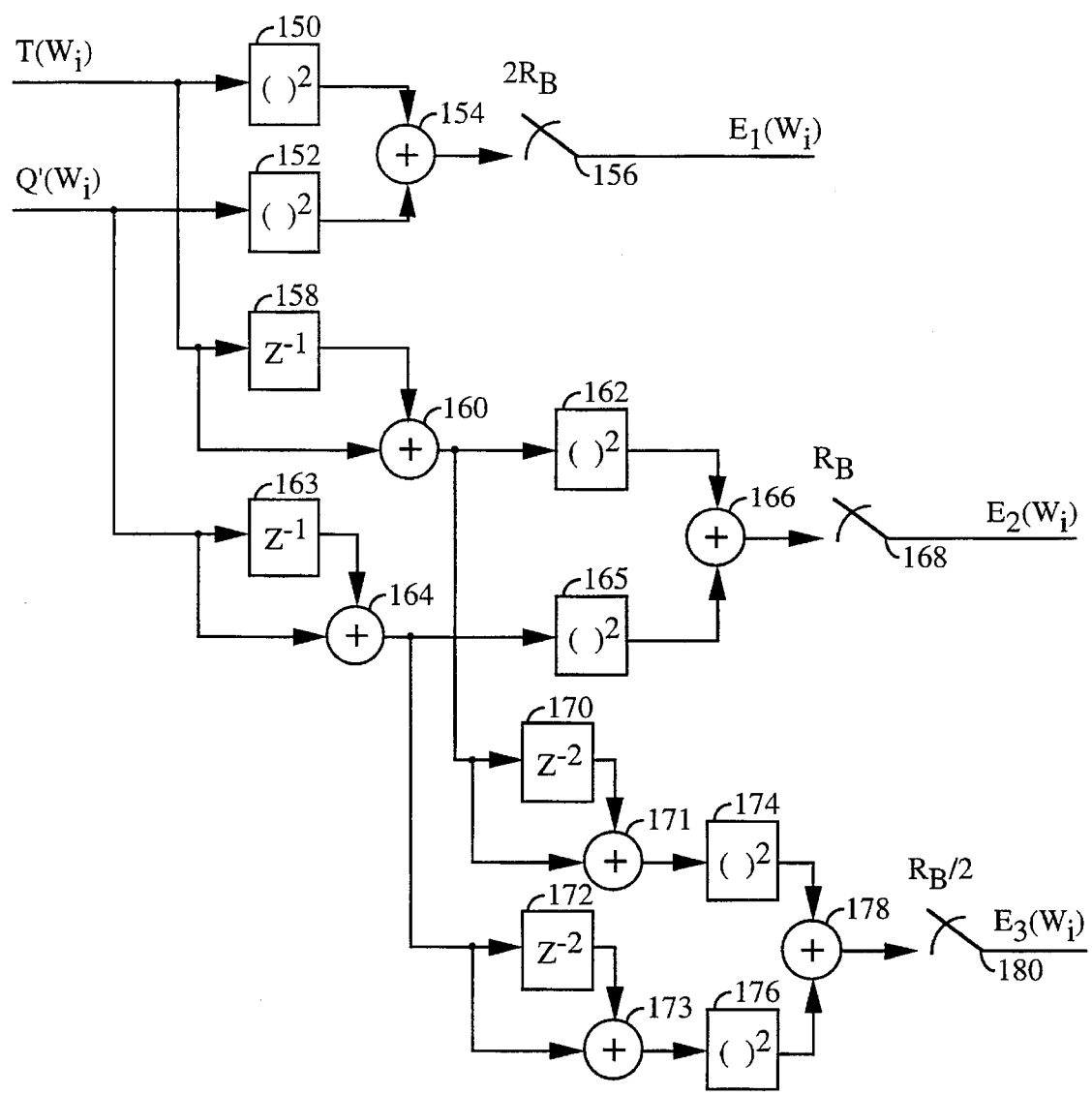
FIG. 4 is an exemplary block diagram of the repetition summer and energy calculator of the present invention.

RSEC 68 operates to take advantage of the redundancy introduced by repetition modulation encoder 8. FIG. 4 illustrates an exemplary embodiment of RSEC 68. The RSEC illustrated in FIG. 4 would be typical of the design used in the cases where repetition modulation encoder 8 provides redundancy of order 1, 2 or 4 (that is red2=1, 2 or 4), and where $E_1(W_i)$, $E_2(W_i)$ and $E_3(W_i)$ are the energy values corresponding to the assumption that $W_i$ was sent with red2 equal one, two and four, respectively.

The computation of $E_1(W_i)$ is performed under the assumption that red2=1 where there is no redundancy in the received modulation symbols I' and Q', so the energy computation is a summing the squares operation. The $I'(W_i)$ symbol is provided to squaring element 150 and the $Q'(W_i)$ symbol is provided to squaring element 152 which provide the squares of inputs, $(I'(W_i))^2$ and $(Q'(W_i))^2$, respectively. $(I'(W_i))^2$ and $(Q'(W_i))^2$ are provided to summing element 154 which provides the sum of the squares of the inputs, that is, $(I'(W_i))^2+(Q'(W_i))^2$. Switch 156 closes when the computed energy value from summing element 154 is valid which is at a rate of $R_{b(max)}/(r.\log M)$.

In the computation of $E_2(W_i)$ there is an assumed redundancy of order 2 in the modulation symbols I' and Q', so the energy computation involves summing two consecutive modulation symbols which should be equal under the presupposition of redundancy of order 2. Delay elements 158 and 163 serve to delay their inputs by one modulation symbol period. Thus, in summer 160 the current modulation symbol $I'(W_i)(t)$ and the modulation symbol $I'(W_i)(t-T_W)$, where $T_W$ is the Walsh symbol period equal to $r.\log M/R_{b(max)}$, that immediately preceded it are summed. Similarly, in summer 164 the current modulation symbol $Q'(W_i)(t)$ and the modulation symbol $Q'(W_i)(t-T_W)$ that immediately preceded it are summed. The sums of the consecutive symbols for each of the modulation symbols $I'(W_i)$ and $Q'(W_i)$ are then squared by squaring elements 162 and 165 respectively, and the squares are summed in summer 166. Switch 168 closes when the computed energy value is valid at a rate of $(0.5.R_{b(max)})/(r.\log M)$.

In the computation of $E_3(W_i)$ it is presupposed that there is redundancy of order 4 in the received modulation symbols I' and Q', so the energy computation involves summing four consecutive modulation symbols which should all be equal. The architecture shown in FIG. 3 exploits the fact that the sums of two consecutive symbols has already been computed by summers 160 and 164. Thus, in order to determine the sum of four consecutive symbols the sum of two consecutive sums of two symbols is computed. Delay element 170 serves to delay its input by two modulation symbol periods, $2.T_W$ where $T_W$ is defined as above. Thus, in summer 171 the sum of the two most current $I'(W_i)$ modulation symbols for hypothesis $W_i$ and the sum of two $I'(W_i)$ modulation symbols for the same hypothesis two symbol periods previous is computed.

Similarly, in summer 173 the sum of the two most current $Q'(W_i)$ modulation symbols and the sum of two $Q'(W_i)$ modulation symbols two symbol periods previous is computed. The sums of the four consecutive symbols for modulation symbols $I'(W_i)$ and $Q'(W_i)$ are then squared by squaring elements 174 and 176, respectively and the squares are summed in summer 178. Switch 180 closes when the energy data is valid at a rate of $(0.25.R_{b(max)})/(r.\log M)$. The computed energy values are then provided to finger combine logic 72. An alternative method for computing $E_3(W_i)$ is by means of partial integration wherein the $E_2(W_i)$ outputs provided through switch 168 are summed in pairs to provide $E_3(W_i)$. The partial integration technique is particularly useful in high mobility environments.

The energy value outputs of RSEC 68 are the outputs of first finger or receiver system 70. The second receiver system processes the received signals in a manner similar to that discussed with respect to the first receiver system of FIGS. 2, 3 and 4. The energy values for each L rate hypotheses and corresponding M Walsh code hypotheses are provided to finger combine logic 72. Similarly, any number of additional receiver apparatus can be placed in parallel to provide additional energy data from signals received by different antennas or by signals received by the same antenna but temporally differentiated, as in the case of reception of multipath signals.

The energy values from first finger demodulation apparatus 70 and all other fingers is provided to finger combine logic 72. Finger combine logic then combines the signals of the various fingers as a weighted sum and provides the cumulative energy values to metric generator 74.

Metric generator 74 in response to the energy values determines a set of metrics for each rate, an exemplary embodiment of such a metric generator is disclosed in copending U.S. patent application entitled "Dual Maxima Metric Generation", Ser. No, 08/083,110, and assigned to the assignee of the present invention. The sets of metrics are provided to de-interleaver 76. De-interleaver 76 performs a function as the inverse of interleaver 4.

The deinterleaved metrics are then provided to variable rate decoder 78 which in accordance with the received metrics generates an estimate of the transmitted information data bits. A typical implementation of decoder 78 is a Viterbi decoder of a type capable of decoding data encoded at the personal system unit with a constraint length K=9, and of a code rate r=⅓. The Viterbi decoder is utilized to determine the most likely information bit sequence. Periodically, nominally 1.25 msec, a signal quality estimate is obtained and transmitted as a personal system unit power adjustment command along with data to the personal system unit. Further information on the generation of this quality estimate is discussed in further detail in the copending application mentioned above. This quality estimate is the average signal-to-noise ratio over the 1.25 msec interval. Exemplary embodiments of the decoder are disclosed in copending U.S. patent application entitled "Rate Determination", Ser. No. 08/079,196.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. An apparatus for transmitting a variable rate data packet of data symbols, said apparatus comprising:

repetition generator means for receiving said packet and when the number of said data symbols in said packet is less than a first value generating duplicates of said data symbols and combining said data symbols and said duplicates of said data symbols in said packet; and transmitter means for transmitting said packet from said repetition generator means, wherein when the number of data symbols in said packet equals said first value, transmitting said packet at a first energy level and when the number of data symbols in said packet is less than said first value and greater than a second value, transmitting said packet at a second energy level which is less than said first energy level, and when the number of data symbols in said packet is less than said second value gating ones of said data symbols and said duplicates of said data symbols and transmitting said packet at a third energy level.

2. The apparatus of claim 1 further comprising spreading means interposed between said repetition generator means and said transmitter means for receiving said packet and modulating said packet in accordance with a spread spectrum modulation format.

3. The apparatus of claim 2 wherein said spreading means comprises:

first PN generator means for generating a first pseudorandom noise sequence; and first mixing means for receiving said packet and said first pseudorandom noise sequence and for spreading said packet in accordance with said first pseudorandom noise sequence to output a spread packet.

4. The apparatus of claim 3 wherein said spreading means further comprises:

second PN generator means for generating a second pseudorandom noise sequence;

second mixing means for receiving said spread packet and said second pseudorandom noise sequence and for digitally mixing said spread packet with said second pseudorandom noise sequence;

third PN generator means for generating a third pseudorandom noise sequence; and third mixing means for receiving said spread packet and said third pseudorandom noise sequence and for digitally mixing said spread packet with said third pseudorandom noise sequence.

5. The apparatus of claim 4 further comprising offset quadrature phase shift keying (OQPSK) modulation means interposed between said spreading means and said transmitter means for receiving said spread packet and modulating said packet in accordance with an offset quadrature phase shift keying modulation format.

6. The apparatus of claim 1 wherein said transmitter means is further for reordering said data symbols and said duplicates of said data symbols in accordance with a pseudorandom reordering format when the number of data symbols in said packet is less than said second value.

7. The apparatus of claim 1 further comprising an encoder means preceding said repetition generator means for receiving said packet and for encoding said data symbols in accordance with an error correction encoding format.

8. The apparatus of claim 7 further comprising an interleaver means interposed between said encoder means and said repetition generator means for receiving said packet from said encoder means and for reordering said data symbols in said packet in accordance with an interleaving format.

9. The apparatus of claim 1 wherein said second energy level is one of a set of possible second energy levels and wherein said third energy level is the minimum energy level in said set of possible second energy levels.

10. The apparatus of claim 1 wherein the ratio between said second energy level and said first energy level equals the ratio between the said number of data symbols in said packet and said first value.

11. A method for transmitting a variable rate data packet of data symbols, said method comprising the steps of:

receiving said packet;

when the number of said data symbols in said packet is less than a first value generating duplicates of said data symbols and combining said data symbols and said duplicates of said data symbols in said packet;

when the number of data symbols in said packet equals said first value, transmitting said packet at a first energy level;

when the number of data symbols in said packet is less than said first value and greater than a second value, transmitting said packet at a second energy level which is less than said first energy level; and when the number of data symbols in said packet is less than said second value gating ones of said data symbols and said duplicates of said data symbols and transmitting said packet at a third energy level.

12. The method of claim 11 further comprising the step of modulating said packet in accordance with a spread spectrum modulation format.

13. The method of claim 12 wherein said step of modulating said packet in accordance with a spread spectrum modulation format comprises the steps of:

generating a first pseudorandom noise sequence; and spreading said packet in accordance with said first pseudorandom noise sequence to output a spread packet.

14. The method of claim 13 wherein said step of modulating said packet in accordance with a spread spectrum modulation format further comprises the steps of:

generating a second pseudorandom noise sequence;

digitally mixing said spread packet with said second pseudorandom noise sequence;

generating a third pseudorandom noise sequence; and digitally mixing said spread packet with said third pseudorandom noise sequence.

15. The method of claim 14 further comprising the step of modulating said packet in accordance with an offset quadrature phase shift keying (OQPSK) modulation format.

16. The method of claim 11 further comprising the step of reordering said data symbols and said duplicates of said data symbols in accordance with a pseudorandom reordering format when the number of data symbols in said packet is less than said second value.

17. The method of claim 11 further comprising the step of encoding said data symbols in accordance with an error correction encoding format.

18. The method of claim 17 further comprising the step of reordering said data symbols in said packet in accordance with an interleaving format.

19. The method of claim 1 wherein said second energy level is one of a set of possible second energy levels and wherein said third energy level is the minimum energy level in said set of possible second energy levels.

20. The method of claim 11 wherein the ratio between said second energy level and said first energy level equals the ratio between the said number of data symbols in said packet and said first value.

21. A system for transmitting a variable rate data packet of data symbols, said system comprising:

a repetition generator having an input and having an output;

a transmitter having an input coupled to said repetition generator output and having an output;

a spread spectrum modulator interposed between said repetition generator and said transmitter having an input coupled to said repetition generator output and having an output coupled to said transmitter input, said spread spectrum modulator comprising:

a first PN generator having an output; and a first mixer having a first input coupled to said repetition generator output and having a second input coupled to said first PN generator output and having an output.

22. The system of claim 21 wherein said spread spectrum modulator comprises:

a second PN generator having an output;

a second mixer having a first input coupled to said first mixer output and having a second input coupled to said second PN generator output;

a third PN generator having an output; and third mixer having a first input coupled to said first mixer output and having a second input coupled to said third PN generator output.

23. The system of claim 21 further comprising an offset quadrature phase shift keying modulator having a first input coupled to said second mixer output and having a second input coupled to said third mixer output and having an output coupled to said transmitter input.

24. A system for transmitting a variable rate data packet of data symbols, said system comprising:

a repetition generator having an input connected to receive said packet of data symbols for generating duplicates of said data symbols when the number of data symbols in said packet is less than a first value and having an output at which a combination of said data symbols and said duplicates of said data symbols in said packet is provided as a data packet; and a transmitter having an input connected to receive the output of said repetition generator and having an output from which data symbols received from said repetition generator are transmitted at a first energy level when the number of data symbols in said packet equals said first value, at a second energy level, which is less than said first energy level, when the number of data symbols in said packet is less than said first value.

25. The system of claim 24 wherein said transmitter transmits data symbols:

at said second energy level when the number of data symbols in said packet is less than said first value but greater than a second value, and at a third energy level when the number of data symbols in said packet is less than said second value.

26. The system of claim 24 further comprising a spread spectrum modulator interposed between said repetition generator and said transmitter having an input coupled to said repetition generator output and having an output coupled to said transmitter input.

27. The system of claim 26 wherein said spread spectrum modulator comprises:

a first PN generator having an output; and a first mixer having a first input coupled to said repetition generator output and having a second input coupled to said first PN generator output and having an output.

28. The system of claim 27 wherein said spread spectrum modulator comprises:

a second PN generator having an output;

a second mixer having a first input coupled to said first mixer output and having a second input coupled to said second PN generator output;

a third PN generator having an output; and a third mixer having a first input coupled to said first mixer out-put and having a second input coupled to said third PN generator output.

29. The system of claim 27 further comprising an offset quadrature phase shift keying modulator having a first input coupled to said second mixer output and having a second input coupled to said third mixer output and having an output coupled to said transmitter input.

\* \* \* \* \*